(12) United States Patent
Cheng et al.

(10) Patent No.: US 7,514,365 B2
(45) Date of Patent: Apr. 7, 2009

(54) METHOD OF FABRICATING OPENING AND PLUG

(75) Inventors: Yi-Fang Cheng, Hsinchu County (TW); Chopin Chou, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 135 days.

(21) Appl. No.: 11/164,273

(22) Filed: Nov. 16, 2005

(65) Prior Publication Data
US 2007/0111513 A1  May 17, 2007

(51) Int. Cl.
*H01L 21/311* (2006.01)
(52) U.S. Cl. ............... 438/700; 438/624; 438/702; 438/723; 257/E21.313; 257/E21.317; 257/E21.577
(58) Field of Classification Search ............... 438/624, 438/700, 702, 723, 705, 735, 622, 639, 672, 438/638, 623, 734, 725; 257/E21.332, E21.334, 257/E21.483, E21.487, E21.579, E21.218, 257/E21.247, E21.248, E21.496, E21.313, 257/E21.317, E21.577
See application file for complete search history.

(56) References Cited

U.S. PATENT DOCUMENTS

| | | | | |
|---|---|---|---|---|
| 5,635,423 | A * | 6/1997 | Huang et al. | 438/638 |
| 5,795,813 | A * | 8/1998 | Hughes et al. | 438/423 |
| 5,933,761 | A * | 8/1999 | Lee | 438/783 |
| 5,985,753 | A * | 11/1999 | Yu et al. | 438/637 |
| 6,013,581 | A * | 1/2000 | Wu et al. | 438/734 |
| 6,187,666 | B1 * | 2/2001 | Singh et al. | 438/633 |
| 6,248,644 | B1 * | 6/2001 | Yang et al. | 438/424 |
| 6,284,644 | B1 * | 9/2001 | Aug et al. | 438/623 |
| 6,358,842 | B1 * | 3/2002 | Zhou et al. | 438/633 |
| 6,632,707 | B1 | 10/2003 | Wang et al. | |
| 6,706,611 | B2 * | 3/2004 | Jeng | 438/407 |
| 7,183,183 | B2 * | 2/2007 | Duerksen et al. | 438/524 |
| 2003/0082924 | A1 * | 5/2003 | Andideh et al. | 438/778 |
| 2003/0129844 | A1 * | 7/2003 | Wang et al. | 438/694 |
| 2005/0087516 | A1 | 4/2005 | Duerksen et al. | |

FOREIGN PATENT DOCUMENTS

JP  2000-243829  9/2000

OTHER PUBLICATIONS http://en.wikipedia.org/wiki/Plasma_%28physics%29.*

* cited by examiner

*Primary Examiner*—Matthew Smith
*Assistant Examiner*—Julio J Maldonado
(74) *Attorney, Agent, or Firm*—Jianq Chyun IP Office (57) ABSTRACT

A method of fabricating an opening or plug. In the process of forming the opening, before a photoresist layer is formed over a dielectric layer, a treatment process is performed to form a film on the dielectric layer, wherein the film can suppress the outgasing phenomenon of the dielectric layer and prevent the later formed photoresist layer from reacting with the running-off composition component from the dielectric layer. Therefore, the problem of incomplete development due to outgasing of the dielectric layer can be solved. Additionally, in the procedure for forming a plug, before a block layer is forming on a surface of a via, a treatment process is performed to form a film on the surface of the via. Therefore, the problem of having defects inside the block layer caused by outgasing of the dielectric layer can be overcome.

19 Claims, 5 Drawing Sheets

METHOD OF FABRICATING OPENING AND PLUG

BACKGROUND OF THE INVENTION

1. Field of the Invention

The present invention relates to a method of fabricating openings and plugs. More particularly, the present invention relates to a method of manufacturing openings and plugs for effectively suppressing outgasing of dielectric material.

2. Description of the Related Art

When the Ultra Large Scale Integration technology is mature to be able to manufacture the line width below 0.13 micro meter, in order to increase the processing speed of the chip, it is necessary to overcome the delay due to impedance and capacitance. Therefore, copper and the dielectric material with relatively low dielectric constant are used to form the interconnecting structure. However, because of the relatively worse physical properties, such as relatively soft, relatively thermal unstable, relatively hard to manufacture and relatively easy to run off the composition element (the so-called outgasing phenomenon), of the dielectric material with relatively low dielectric constant, it is difficult to maintain good-defect control in copper/low dielectric material process.

Figure 1A:
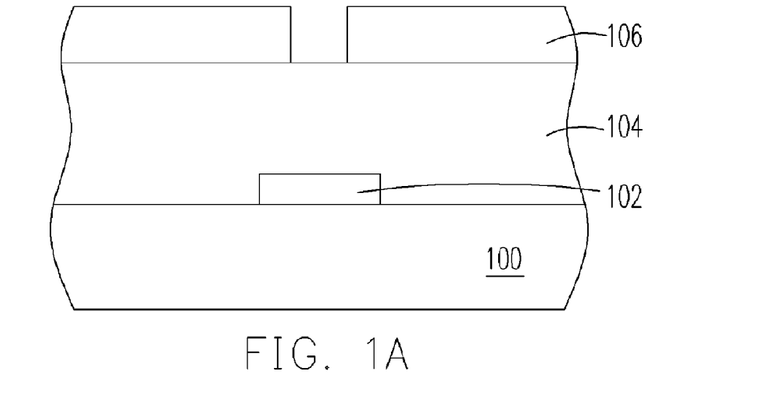
FIGS. 1A through 1C are schematic cross-sectional views showing the conventional progression of manufacturing steps for producing an opening for dual damascene structure.
Figure 1B:
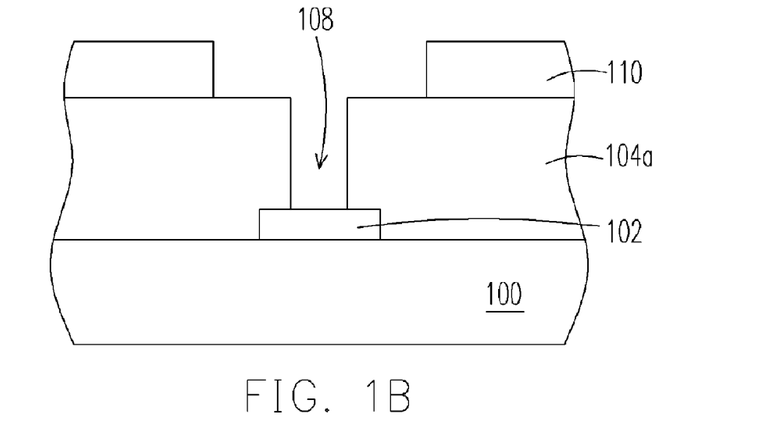
Figure 1C:
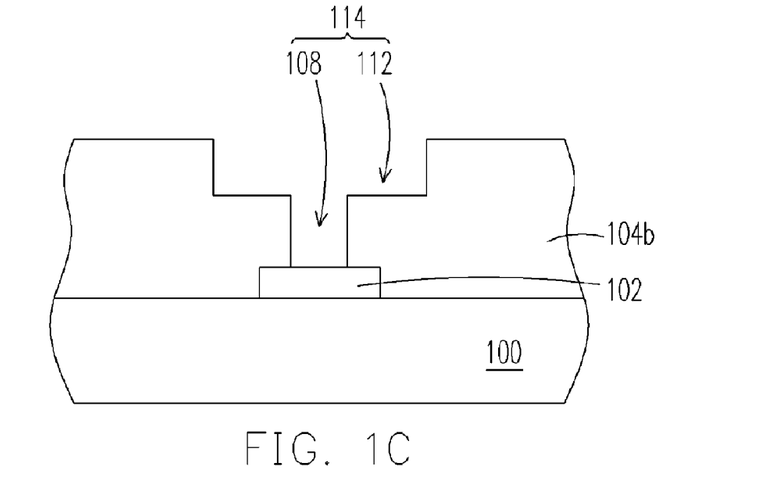

FIGS. 1A through 1C are schematic cross-sectional views showing the conventional progression of manufacturing steps for producing an opening for dual damascene structure.

As shown in FIG. 1A, a dielectric layer 104 is formed over a substrate 100 partially covered by a conductive layer 102. The dielectric layer 104 is made from dielectric material with relatively low dielectric constant. A patterned photoresist layer 106 is formed on the dielectric layer 104 and exposes portion of the dielectric layer 104.

Referring to FIG. 1B, a portion of the dielectric layer 104 is removed by using photoresist layer 106 (as shown in FIG. 1A) as a mask until the conductive layer 102 is exposed to form a via 108 in a dielectric layer 104a. The photoresist layer 106 is removed. A patterned photoresist layer 110 is formed over the substrate 100.

As shown in FIG. 1C, a portion of the dielectric layer 104a is removed to form a via 108a and a trench 112 in a dielectric layer 104b by using the patterned photoresist layer 110 (as shown in FIG. 1B) as a mask. The via 108a and the trench 112 are composed to form a dual damascene opening 114. The photoresist layer 110 is removed.

In the process described above, the dielectric layer 104 itself has outgasing phenomenon, that is the component of the dielectric layer 104 running off. Therefore, the portion of the photoresist layers in touch with the dielectric layer 104 will react with the running-off dielectric component and the latter development process on the photoresist layers will happen to be incomplete. Hence, the definition for forming via and trench will be inaccuracy. Furthermore, in the latter manufacturing procedure, in order to prevent the filling metal in opening from spike phenomenon, electromigration or poor adhesion, a block layer is formed in the opening to be a protection. Nevertheless, defects will be formed in the block layer since the outgasing of the dielectric layer with relatively low dielectric constant and then the reliability of the device is decreased.

There is a well known method for improving the outgasing phenomenon of the dielectric layer with relatively low dielectric constant, that is forming a block layer on the dielectric layer. However, this kind of method will lead to higher manufacturing cost and producing extra stress to induce further defects. Additionally, because of the existence of the block layer, it is easy to induce parasitic capacitors, especially when the block layer is formed by dielectric layer with relatively high dielectric constant.

SUMMARY OF THE INVENTION

Accordingly, at least one objective of the present invention is to provide a method of manufacturing an opening capable of solving the incomplete development problem caused by outgasing phenomenon of the dielectric layer and obtaining a relatively accuracy opening pattern.

At least a second objective of the present invention is to provide a method of manufacturing a plug capable of increasing the reliability of the device by suppressing the outgasing phenomenon of the dielectric layer to protect the block layer from having defects.

To achieve these and other advantages and in accordance with the purpose of the invention, as embodied and broadly described herein, the invention provides a method of method of manufacturing an opening. The method comprises the steps of forming a dielectric layer over a conductive layer. Then, a patterned mask layer is formed on the dielectric layer, wherein the patterned mask layer exposes a portion of the dielectric layer which is predetermined to form a trench in. A treatment process is performed on the exposed portion of the dielectric layer to form a film, wherein the film protects the dielectric layer from running off a plurality of composition components. A patterned photoresist layer is formed on the patterned mask layer and the film, wherein the patterned photoresist layer exposes a portion of the film and the mask layer which is predetermined to form a via in. A portion of the dielectric layer is removed by using the patterned photoresist layer as a mask to form a first via. Thereafter, the patterned photoresist layer is removed. A portion of the dielectric layer is removed by using the patterned mask layer as a mask to form a trench and to convert the first via to a second via, wherein the trench is located over the second via.

The present invention further provides another method of manufacturing an opening. The method comprises the steps of forming a dielectric layer having a via over a conductive layer, wherein the via exposes a surface of the conductive layer. Then, a treatment process is performed on a surface of the dielectric layer to form a film, wherein the film protects the dielectric layer from running off a plurality of composition components. A patterned photoresist layer is formed over the dielectric layer, wherein the patterned photoresist layer exposes a portion of the film, and a portion of the dielectric layer under the exposed film is predetermined to form a trench in. A portion of the dielectric layer is removed by using the patterned photoresist layer as a mask to form a trench, wherein the trench is located over the via. The patterned photoresist layer is removed.

The present invention also provides a method of manufacturing an opening. The method comprises the steps of forming a dielectric layer having a trench over a conductive layer. A treatment process is performed on a surface of the dielectric layer to form a film, wherein the film protects the dielectric layer from running off a plurality of composition compo nents. A patterned photoresist layer is formed over the dielectric layer, wherein the patterned photoresist layer exposes a portion of the film, and a portion of the dielectric layer under the exposed film is predetermined to form a via in. A via exposing a portion of the conductive layer in the dielectric layer is formed by using the patterned photoresist layer as a mask and removing a portion of the dielectric layer, wherein the trench is located over the via. The patterned photoresist layer is removed.

The present invention also provides a method of manufacturing a plug. The method comprises the steps of forming a patterned dielectric layer over a first conductive layer, wherein the patterned dielectric layer possesses an opening exposing a portion of the first conductive layer. A treatment process is performed on a surface of the patterned dielectric layer to form a film, wherein the film protects the dielectric layer from running off a plurality of composition components. A block layer is formed on a surface of the opening. A second conductive layer is formed in the opening.

In the present invention, the thickness of the film can be smaller than 1000 angstroms. Moreover, the treatment process can be, For example, an ion implantation process or a gas plasma process. Additionally, the dopants used in the ion implantation process mentioned above can be, for example, boron, boron fluoride, phosphine, arsenic, aluminum or fluoride, and the dosage of the dopants can be of about $10^{14}$-$10^{16}$ atoms/cm$^2$. Further, the energy for performing the ion implantation process mentioned above can be of about 80-120 KeV. Furthermore, the gas used in the gas plasma process mentioned can be, For example, nitrogen, oxygen or hydrogen, and the density of the gas plasma can be of about $10^{-11}$-$10^{-13}$ ions/atom. Further, the dielectric layer can be made of the material with relatively low dielectric constant or fluorine-containing glass. The opening in the invention is constructed by a via and a trench, and the trench is located over the via.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2A:
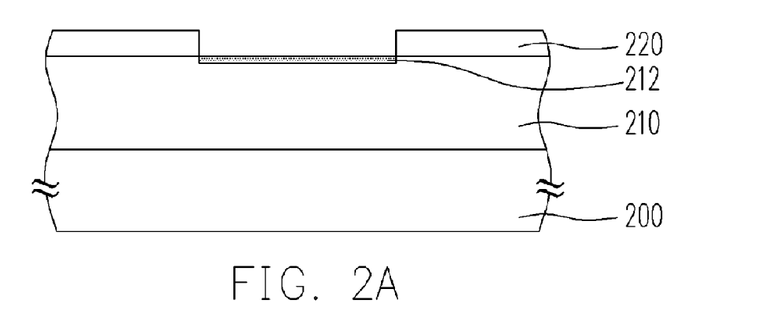
FIGS. 2A through 2C are cross-sectional views showing the steps for fabricating an opening according to a preferred embodiment of the present invention.
Figure 2B:
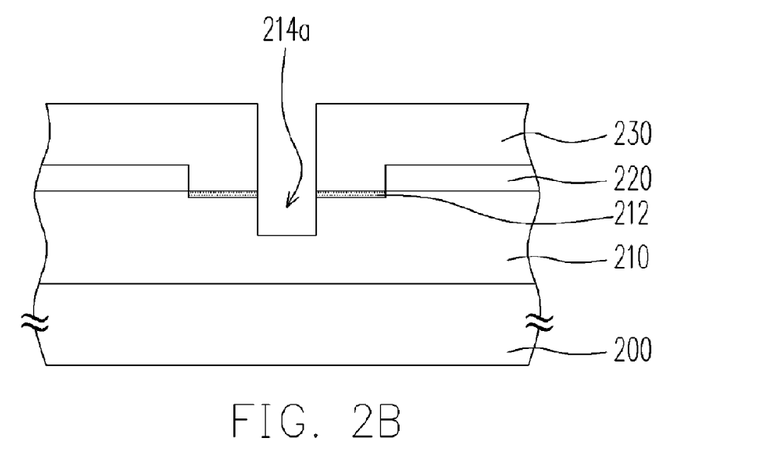
Figure 2C:
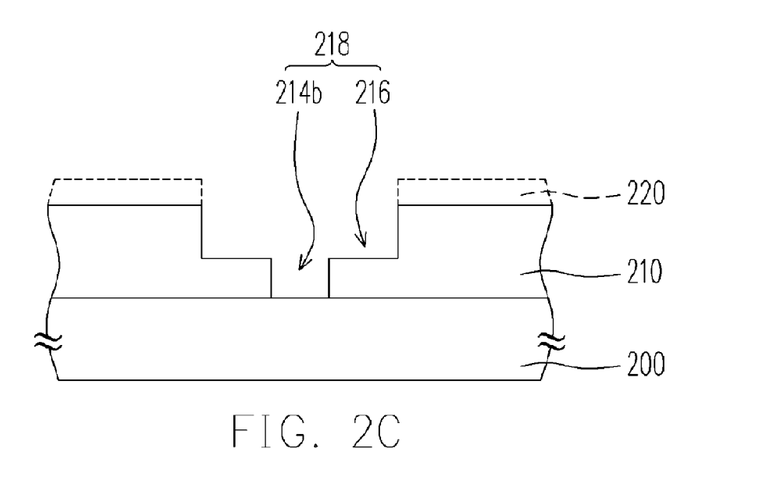

FIGS. 2A through 2C are cross-sectional views showing the steps for fabricating an opening according to a preferred embodiment of the present invention.

As shown in FIG. 2A, a dielectric layer 210 is formed on a conductive layer 200. The conductive layer 200 can be formed, for example, from copper and is formed on a semiconductor substrate (not shown) to be used to electrically connect with other devices in the substrate. The dielectric layer 210 can be made from, for example, the dielectric material with relatively low dielectric constant or fluoro silicon glass by chemical vapor deposition. A patterned mask layer 220 is formed on the dielectric layer 210. The patterned mask layer 220 exposes portion of the dielectric layer 210 which is predetermined to form trenches. For example, the patterned mask layer 220 can be formed from silicon nitride and the method for forming the patterned mask layer 220 can comprise the steps of forming a patterned photoresist layer on the mask layer by photolithography and performing an asymmetric etching process to form the patterned mask layer 220 and removing the photoresist layer.

A film 212 is formed on a portion of the dielectric layer 210 exposed by the patterned mask layer 220. The film 212 can prevent the dielectric layer 210 from the outgasing phenomenon. Moreover, the film 212 is formed by damaging portion of the dielectric layer 210. The damaged dielectric layer 210 is converted into the porous film 212. The film 212 with the porous property can effectively prevent the dielectric layer 210 from running off composition components. Furthermore, the thickness of the film 212 can be smaller than 1000 angstroms. In the preferred embodiment of the present invention, the method of forming the film 212 can comprises, for example, the steps of performing an ion implantation. The dopants used in the ion implantation can be, for example, boron, boron fluoride, phosphine, arsenic, aluminum or fluoride and the dosage of the dopants is of about $10^{14}$-$10^{16}$ atoms/cm$^2$. Additionally, the energy for performing the ion implantation is of about 80-120 KeV. In the other preferred embodiment or the present invention, the method for forming film 212 can comprise, for example, the steps of performing a gas plasma process. The gas used in gas plasma process can be, for example, nitrogen, oxygen or hydrogen and the density of the plasma is of about $10^{-11}$-$10^{-13}$ ions/atom.

As shown in FIG. 2B, a patterned photoresist layer 230 is formed over the dielectric layer 210. The patterned photoresist layer 230 exposes a portion of the film 212 and the exposed portion of the film 212 covers the portion of the dielectric layer 210 which a via is predetermined to be formed in. The patterned photoresist layer 230 can be formed by, for example, spinning coating a photoresist material layer (not shown) over the substrate 200 and performing a exposure process and a development process subsequently. Specially, since the film 212 is previously formed on the surface of the exposed dielectric layer 210, the composition components of the dielectric later 210 will not run off easily during the procedure of forming the patterned photoresist layer 230. Therefore, the incomplete development will not happen during the development process. Thereafter, by using the patterned photoresist layer 230 as a mask, the exposed portion of the dielectric layer 210 is removed to form a portion of the via 214a. The method for removing the portion of the dielectric layer 210 can be, for example, an asymmetric etching process.

As shown in FIG. 2C, the photoresist layer 230 is removed, wherein the method for removing the photoresist layer 230 can be, for example, a wet etching process. By using the patterned mask layer 220 as a mask, the exposed portion of the dielectric layer 210 is removed until the surface of the conductive layer 200 is exposed to form a trench 216 and to transfer the via 214a (as shown in FIG. 2B) into a via 214b in the dielectric layer 210. The trench 216 is located over the via 214b, and the trench 216 and the via 214b are constructed to form an opening 218. The method for removing the exposed dielectric layer 210 can be, for example, an asymmetric etching process. Moreover, the patterned mask layer 220 is removed by, for example, a wet etching process.

Second Embodiment

Figure 3A:
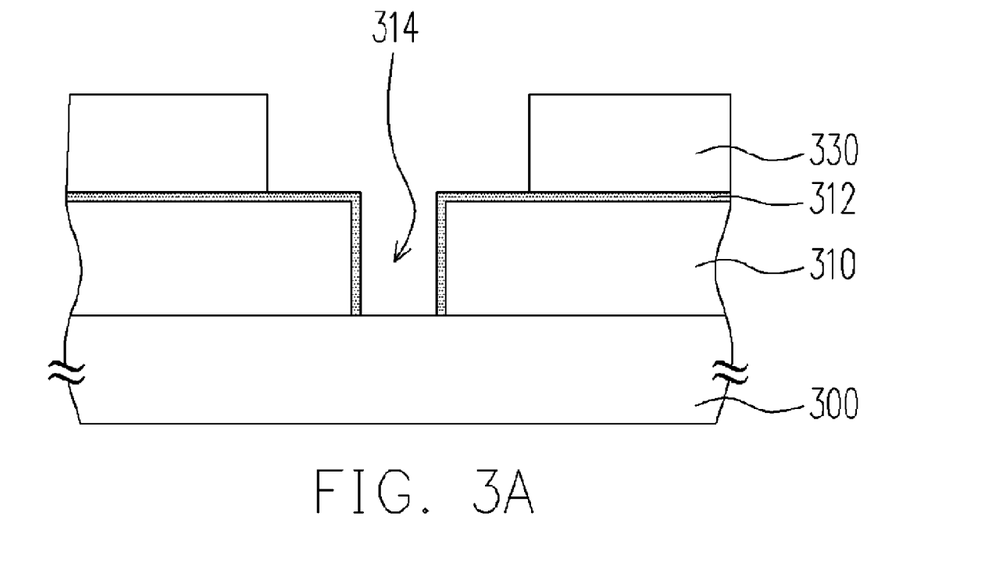
FIGS. 3A through 3B are cross-sectional views showing the steps for fabricating an opening according to a preferred embodiment of the present invention.
Figure 3B:
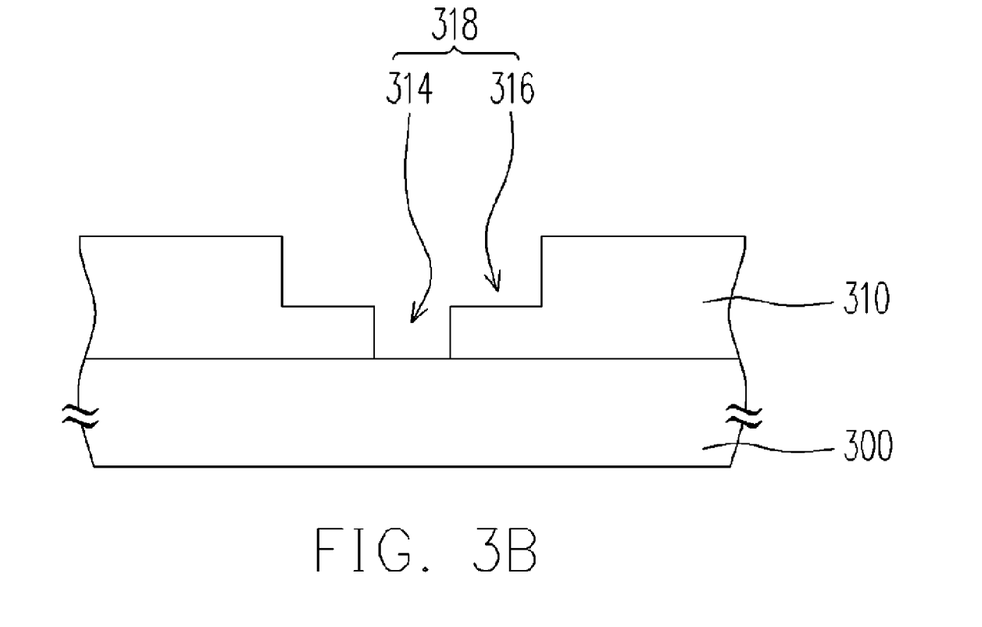

FIGS. 3A through 3B are cross-sectional views showing the steps for fabricating an opening according to a preferred embodiment of the present invention.

As shown in FIG. 3A, a dielectric layer 310 having a via 314 is formed over a conductive layer 300, wherein the via 314 exposes a portion of the surface of the conductive layer 300. The conductive layer 300 can be made of, for example, copper. Additionally, the conductive layer 300 is formed over a semiconductor substrate (not shown) and electrically connects with devices (not shown) formed in the semiconductor substrate. Moreover, the method for forming the dielectric layer 310 having a via 314 comprises, for example, the steps of forming a dielectric material layer (not shown) over the conductive layer 300 by chemical vapor deposition (CVD) and performing a photolithography process and an etching process. The dielectric layer 310 can be formed of, for example, dielectric material with relatively low dielectric constant or fluorine-containing glass.

A treatment process is performed on the exposed surface of the dielectric layer 310 to form a film 312. The film 312 can protect the dielectric layer 310 from outgasing. Moreover, the film 312 is formed by damaging portion of the dielectric layer 310. The damaged dielectric layer 310 is converted into rho porous film 312. The film 312 with the porous property can effectively prevent the dielectric layer 310 from running off composition components. Furthermore, the thickness of the film 312 can be smaller than 1000 angstroms. In the preferred embodiment of the present invention, the treatment process for forming the film 312 can comprises, for example, the steps of performing an ion implantation. The dopants used in the ion implantation can be, for example, boron, boron fluoride, phosphine, arsenic, aluminum or fluoride and the dosage of the dopants is of about $10^{14}$-$10^{16}$ atoms/cm$^2$. Additionally, the energy for performing the ion implantation is of about 80-120 KeV. In the other preferred embodiment of the present invention, the method for forming film 312 can comprise, for example, the steps of performing a gas plasma process. The gas used in gas plasma process can be, for example, nitrogen, oxygen or hydrogen and the density of the plasma is of about $10^{-11}$-$10^{-13}$ ions/atom.

Also, as shown in FIG. 3A, a patterned photoresist layer 330 is formed over the dielectric layer 310 to expose a portion of the film 312. The exposed portion of the film 312 covers a portion of the dielectric layer 310 which a trench is predetermined to be formed in. The patterned photoresist layer 330 can be formed, for example, by spinning coating a photoresist material layer (not shown) over the conductive layer 300 and performing a exposure process and a development process subsequently. Since the film 312 is formed previously on the exposed portion of the dielectric layer 310, the composition components of the dielectric later 310 will not run off easily during the procedure of forming the patterned photoresist layer 330. Therefore, the incomplete development will not happen during the development process.

As shown in FIG. 3B, by using the patterned photoresist layer 330 as a mask, the exposed portion of the film 312 and a portion of the dielectric layer 310 underneath the exposed portion of the film 312 are removed to form a trench 316. The trench 316 is located over the via 314 and the via 314 and the trench 316 are constructed to formed an opening 318. The method for removing the portion of the dielectric layer 310 can be, for example, an asymmetric etching process. Then, the patterned photoresist layer 330 is removed. The method for removing the patterned photoresist layer 330 can be, for example, a wet etching process.

Third Embodiment

Figure 4A:
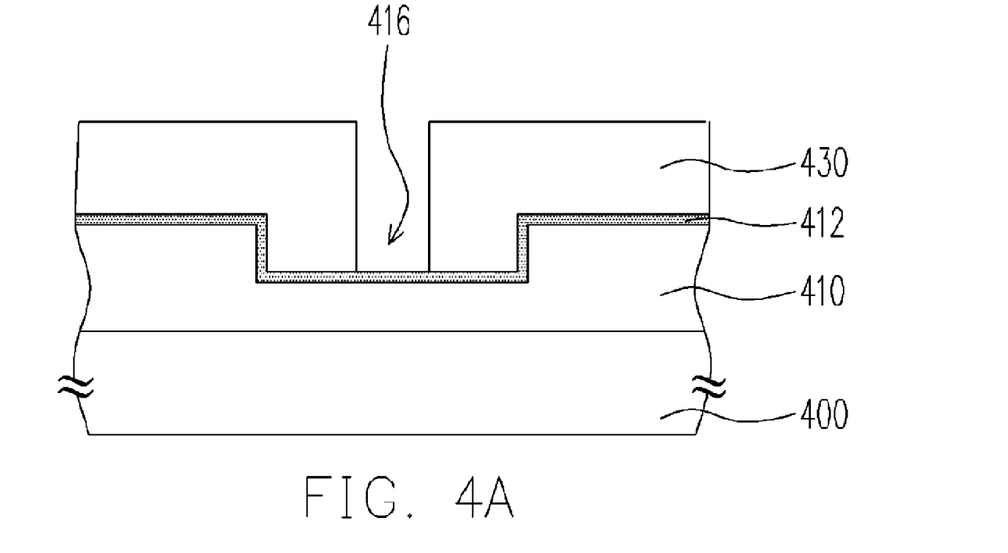
FIGS. 4A through 4B are cross-sectional views showing the steps for fabricating an opening according to a preferred embodiment of the present invention.
Figure 4B:
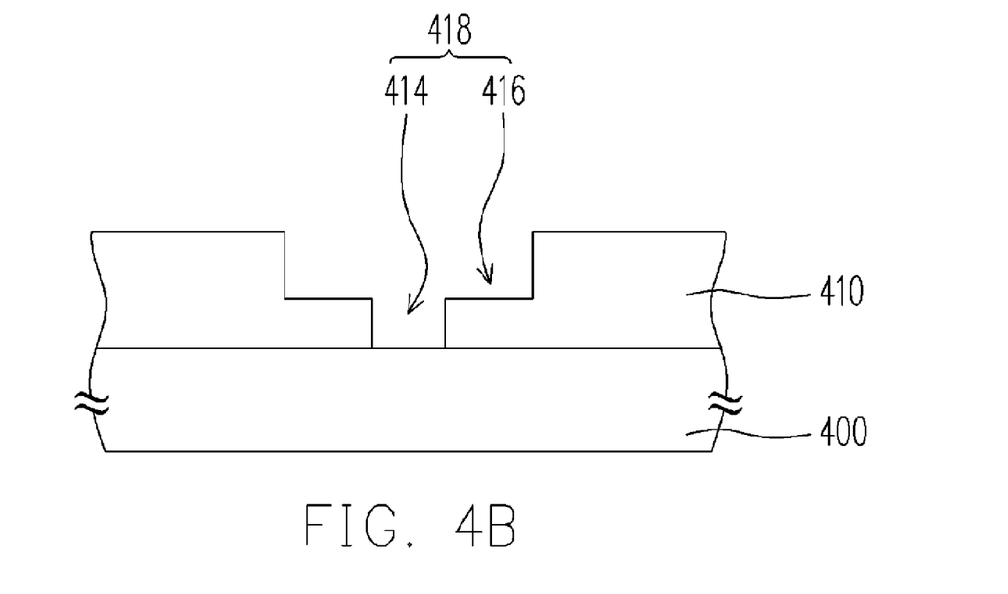

FIGS. 4A through 4B are cross-sectional views showing the steps for fabricating an opening according to a preferred embodiment of the present invention.

As shown in FIG. 4A, a dielectric layer 410 having a trench 416 is formed over a conductive layer 400. The conductive layer 400 can be made of, for example, copper. Additionally, the conductive layer 400 is formed over a semiconductor substrate (not shown) and electrically connects with devices (not shown) formed in the semiconductor substrate. Moreover, the method for forming the dielectric layer 410 having a trench 416 comprises, for example, the steps of forming a dielectric material layer (not shown) over the conductive layer 400 by chemical vapor deposition (CVD) and performing a photolithography process and an etching process. The dielectric layer 410 can be formed of, for example, dielectric material with relatively low dielectric constant or fluorine-containing glass.

A treatment process is performed on the exposed surface of the dielectric layer 410 to form a film 412. The film 412 can protect the dielectric layer 410 from outgasing. Moreover, the film 412 is formed by damaging portion of the dielectric layer 410. The damaged dielectric layer 410 is converted into the porous film 412. The film 412 with the porous property can effectively prevent the dielectric layer 410 from running off composition components. Furthermore, the thickness of the film 412 can be smaller than 1000 angstroms. In the preferred embodiment of the present invention, the treatment process for forming the film 412 can comprises, for example, the steps or performing an ion implantation. The dopants used in the ion implantation can be, for example, boron, boron fluoride, phosphine, arsenic, aluminum or fluoride and the dosage of the dopants is or about $10^{14}$-$10^{16}$ atoms/cm$^2$. Additionally, the energy for performing the ion implantation is of about 80-120 KeV. In the other preferred embodiment of the present invention, the method for forming film 412 can comprise, for example. the steps of performing a gas plasma process. The gas used in gas plasma process can be, For example, nitrogen, oxygen or hydrogen and the density of the plasma is of about $10^{-11}$-$10^{-13}$ ions/atom.

A patterned photoresist layer 430 is formed over the dielectric layer 410 to expose a portion of the film 412. The exposed portion of the film 412 covers a portion of the dielectric layer 410 which a via is predetermined to be formed in. The patterned photoresist layer 430 can be formed, for example, by spinning coating a photoresist material layer (not shown) over the conductive layer 400 and performing a exposure process and a development process subsequently. Since the film 412 is formed previously on the exposed portion of the dielectric layer 410, the composition components of the dielectric later 410 will not run off easily during the procedure of forming the patterned photoresist layer 430. Therefore, the incomplete development will not happen during the development process.

As shown in FIG. 4B, by using the patterned photoresist layer 430 as a mask, the exposed portion of the film 412 and a portion of the dielectric layer 410 underneath the exposed portion of the film 412 are removed to form a via 414. The trench 416 is located over the via 414 and the via 414 and the trench 416 are constructed to formed an opening 418. The method for removing the portion of the dielectric layer 410 can be, for example, an asymmetric etching process. Then, the patterned photoresist layer 430 is removed. The method for removing the patterned photoresist layer 430 can be, for example, a wet etching process.

In the first, the second and the third embodiments, a process for forming a dual damascene opening is provided respectively. In order to alleviate the outgasing phenomenon, the films labeled 212, 312 and 412 are respectively formed between the photoresist layers labeled 230, 330 and 430 and the dielectric layers labeled 210, 310 and 410 by performing a treatment process, respectively. In the other preferred embodiments of the present invention, there is no limitation of the type of the opening formed in the dielectric layer. A film protecting the underneath dielectric layer from outgasing according to the present invention can be formed between the dielectric layer and the photoresist layer to overcome the problem caused by outgasing.

In the embodiments mentioned above, a treatment process is performed on the dielectric layers labeled 210, 310 and 410 respectively to form porous films labeled 212, 312 and 412 respectively to capture the running-off composition component from the dielectric layers labeled 210, 310 and 410. Therefore, the reaction between the dielectric layer and the photoresist layer can be suppressed to avoid the incomplete development. Furthermore, since the dielectric material used to form the dielectric layers labeled 210, 310 and 410 is the material with relatively low dielectric constant, the parasitical capacitance between conductive layers can be effectively decreased.

Figure 5A:
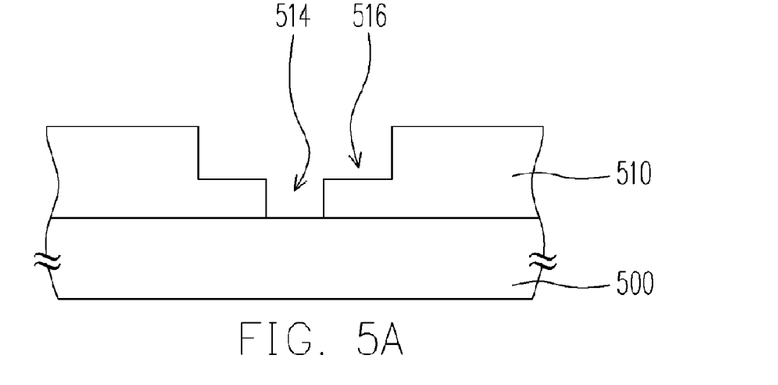
FIGS. 5A through 5C are cross-sectional views showing the steps for fabricating a via according to a preferred embodiment of the present invention.
Figure 5B:
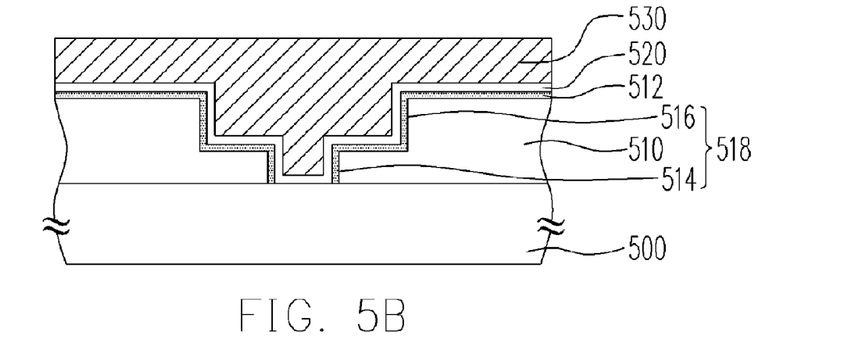
Figure 5C:
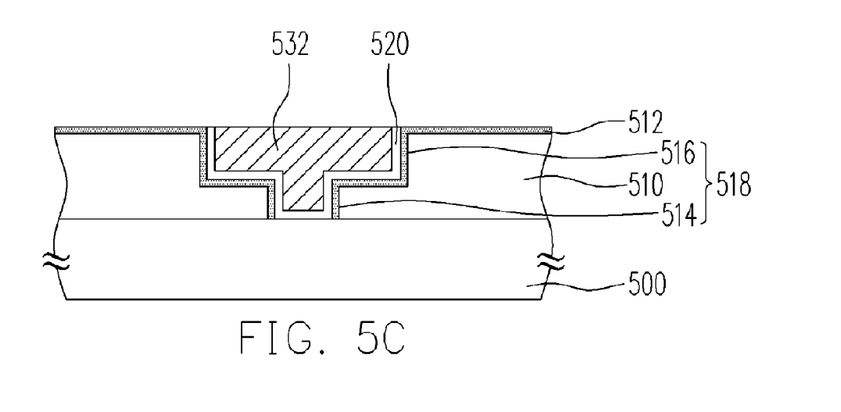

FIGS. 5A through 5C are cross-sectional views showing the steps for fabricating a via according to a preferred embodiment of the present invention.

As shown in FIG. 5A, a dielectric layer 510 having an opening 518 is formed over a conductive layer 500. In a preferred embodiment, the opening 518 is formed by constructing a trench 516 and a via 514 and the trench 516 is located over the via 514. The method for forming the opening 518 can be, for example, the one of the methods described in the first, the second and the third embodiments.

As shown in FIG. 5B, a treatment process is performed on the surface of the dielectric layer 510 to form a film 512. The film 512 can protect the dielectric layer 510 from outgasing. Additionally, the film 512 is formed by damaging portion of the dielectric layer 510. The damaged dielectric layer 510 is converted into the porous film 512. The film 512 with the porous property can effectively prevent the dielectric layer 510 from running off composition components. Furthermore, the thickness of the film 512 can be smaller than 1000 angstroms. In the preferred embodiment of the present invention, the method of forming the film 512 can comprises, for example, the steps of performing an ion implantation. The dopants used in the ion implantation can be, for example, boron, boron fluoride, phosphine, arsenic, aluminum or fluoride and the dosage of the dopants is of about $10^{14}$-$10^{16}$ atoms/cm$^2$. Additionally, the energy for performing the ion implantation is of about 80-120 KeV. In the other preferred embodiment of the present invention, the method for forming film 512 can comprise, for example, the steps of performing a gas plasma process. The gas used in gas plasma process can be, for example, nitrogen, oxygen or hydrogen and the density of the plasma is of about $10^{-11}$-$10^{-13}$ ions/atom.

As shown in FIG. 5B, a block layer 520 is formed over the dielectric layer 510. The block layer 520 can be made of, for example, titanium or titanium nitride by CVD. Particularly, since the film 512 is formed on the dielectric layer 510 previously, the composition component of the dielectric layer 510 will not run off during the procedure of forming the block layer 520. Therefore, there is no defects in the block layer 520 and the reliability of a via formed subsequently can be increased. Thereafter, a conductive layer 530 is formed over the conductive layer 500. The conductive layer 530 can be formed from, for example, copper or tungsten by physical vapor deposition (PVD).

As shown in FIG. 5C, by using the film 512 as a stopping layer, a planarization process is performed on the conductive layer 530 to form a plug 532 in the opening 518. The planarization process can be, for example, a chemical mechanical planarization.

In the preferred embodiment mentioned above, there is provided a process for forming a dual damascene. The film 512 is formed between the block layer 520 and the dielectric layer 510 by performing a treatment process to suppress the ougasing phenomenon. In the other preferred embodiments of the present invention, there is no limitation of the opening being a dual damascene opening. A film protecting the underneath dielectric layer from outgasing according to the present invention can be formed between the dielectric layer and the photoresist layer to overcome the problem caused by outgasing.

Moreover, in the process for forming the plug mentioned above, by performing a treatment process to damage the structure of the surface of the dielectric layer 510, a film 512 with porous property is formed. Therefore, the running-off composition component from the dielectric layer 510 can be captured by the film 512. Further, the reaction between the dielectric layer and the block layer can be suppressed to avoid the block layer from having defects inside.

Altogether, the invention provides at least following advantages:

a) The precision of the opening pattern can be increased by forming a film over the dielectric layer using the treatment process according to the present invention because the film can be used to capture the running-off composition component from the dielectric layer.

b) It is not easy to have parasitic capacitance between the conductive layers since the material used for forming the dielectric layer is the one with relatively low dielectric constant.

c) It is efficient to avoid the dielectric layer from outgasing phenomenon and to prevent the block layer from forming defects by performing the method provided by the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is

1. A method of manufacturing an opening, comprising the steps of:

forming a dielectric layer over a conductive layer;

forming a patterned mask layer on the dielectric layer, wherein the patterned mask layer exposes a portion of the dielectric layer which is predetermined to form a trench in;

performing a treatment process on the exposed portion of the dielectric layer to form a film, wherein the film protects the dielectric layer from running off a plurality of composition components;

forming a patterned photoresist layer on the patterned mask layer and the film, wherein the patterned photoresist layer exposes a portion of the film and the mask layer which is predetermined to form a via in;

removing a portion of the dielectric layer by using the patterned photoresist layer as a mask to form a first via;

removing the patterned photoresist layer; and removing a portion of the dielectric layer by using the patterned mask layer as a mask to form a trench and to convert the first via to a second via, wherein the trench is located over the second via.

2. The method of claim 1, wherein the thickness of the film is smaller than 1000 angstroms.

3. The method of claim 1, wherein the treatment process comprises an ion implantation process or a gas plasma process.

4. The method of claim 3, wherein the dopants used in the ion implantation process comprise boron, boron fluoride, phosphine, arsenic, aluminum or fluoride.

5. The method of claim 3, wherein the dosage of the dopants used in the ion implantation is about $10^{14}$-$10^{16}$ atoms/cm$^2$.

6. The method of claim 3, wherein the energy for performing the ion implantation process is about 80-120 KeV.

7. The method of claim 3, wherein the gas used in the gas plasma process comprises nitrogen, oxygen or hydrogen.

8. The method of claim 3, wherein the density of the gas plasma is about $10^{-11}$-$10^{-13}$ ions/atom.

9. The method of claim 1, wherein the dielectric layer is made of the material with relatively low dielectric constant or fluorine-containing glass.

10. A method of manufacturing an opening, comprising the steps of:

forming a dielectric layer having a via over a conductive layer, wherein the via exposes a surface of the conductive layer;

performing a treatment process on a surface of the dielectric layer to form a film, wherein the treatment process is an ion implantation process, and the film is formed by damaging portion of the dielectric layer and protects the dielectric layer from running off a plurality of composition components, wherein the dopants used in the ion implantation process comprise boron, boron fluoride, phosphine, arsenic, aluminum or fluoride;

forming a patterned photoresist layer over the dielectric layer, wherein the patterned photoresist layer exposes a portion of the film, and a portion of the dielectric layer under the exposed film is predetermined to form a trench in;

removing a portion of the dielectric layer by using the patterned photoresist layer as a mask to form a trench, wherein the trench is located over the via; and removing the patterned photoresist layer.

11. The method of claim 10, wherein the thickness of the film is smaller than 1000 angstroms.

12. The method of claim 10, wherein the dosage of the dopants used in the ion implantation is about $10^{14}$-$10^{16}$ atoms/cm$^2$.

13. The method of claim 10, wherein the energy for performing the ion implantation process is about 80-120 KeV.

14. The method of claim 10, wherein the dielectric layer is made of the material with relatively low dielectric constant or fluorine-containing glass.

15. A method of manufacturing an opening, comprising the steps of:

forming a dielectric layer having a trench over a conductive layer;

performing a treatment process on a surface of the dielectric layer to form a film, the treatment process is an ion implantation process, and the film is formed by damaging portion of the dielectric layer and protects the dielectric layer from running off a plurality of composition components, wherein the dopants used in the ion implantation process comprise boron, boron fluoride, phosphine, arsenic, aluminum or fluoride;

forming a patterned photoresist layer over the dielectric layer, wherein the patterned photoresist layer exposes a portion of the film, and a portion of the dielectric layer under the exposed film is predetermined to form a via in;

forming a via exposing a portion of the conductive layer in the dielectric layer by using the patterned photoresist layer as a mask and removing a portion of the dielectric layer, wherein the trench is located over the via; and removing the patterned photoresist layer.

16. The method of claim 15, wherein the thickness of the film is smaller than 1000 angstroms.

17. The method of claim 15, wherein the dosage of the dopants used in the ion implantation is about $10^{14}$-$10^{16}$ atoms/cm$^2$.

18. The method of claim 15, wherein the energy for performing the ion implantation process is about 80-120 KeV.

19. The method of claim 15, wherein the dielectric layer is made of the material with relatively low dielectric constant or fluorine-containing glass.

* * * * *